(12) United States Patent
Blalock (10) Patent No.: US 7,129,724 B2
(45) Date of Patent: Oct. 31, 2006

(54) PLASMA PROBE

(75) Inventor: Guy T. Blalock, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/190,437

(22) Filed: Jul. 27, 2005

(65) Prior Publication Data

US 2005/0270046 A1 Dec. 8, 2005

Related U.S. Application Data

(62) Division of application No. 10/663,587, filed on Sep. 16, 2003, now Pat. No. 6,952,108.

(51) Int. Cl.
*G01R 31/02* (2006.01)

(52) U.S. Cl. .................. 324/754; 324/158.1; 438/17
(58) Field of Classification Search .................. None
See application file for complete search history.

(56) References Cited

U.S. PATENT DOCUMENTS

| | | | |
|---|---|---|---|
| 5,065,201 A | | 11/1991 | Yamauchi |
| 5,177,439 A | * | 1/1993 | Liu et al. .................. 324/754 |
| 5,315,145 A | | 5/1994 | Lukaszek |
| 5,594,328 A | | 1/1997 | Lukaszek |
| 6,051,443 A | | 4/2000 | Ghio et al. |
| 6,140,833 A | | 10/2000 | Flietner et al. |
| 6,144,037 A | | 11/2000 | Ryan et al. |
| 6,214,716 B1 | * | 4/2001 | Akram .................. 438/612 |
| 6,303,988 B1 | * | 10/2001 | Crumly .................. 257/690 |
| 6,680,484 B1 | * | 1/2004 | Young .................. 257/48 |

OTHER PUBLICATIONS

Boedo, J., "UCSD-FERP Boundary Diagnostics for NSTX," NSTX PAC Meeting, May 1997, 6 pages, no date.
Zhang et al., Fast Reciprocating Probes for Edge Profile Characterization on NSTX, http://pisces.uesd.edu/www/nstx, Jan. 1998, 1 page, no date.
Lukaszek et al., CHARM: A New Wafer Surface Charge Monitor, TechCon '90, San Jose, 4 pages, no date month/year.
Moyer, Rick, "Langmuir Probes and Boundary Plasma Measurements," Dlll-D News, http://fusion.gat.com/DNT/DNT21.htm, Aug. 1994, 3 pages, no date.
Moyer, Rick, "UC San Diego Boundary Diagnostics for NSTX," NSTX FY98 Research Forum, Dec. 1997, pp. 1-11, no date.
Moyer, Rick, "UC San Diego Boundary Diagnostics for NSTX," NSTX FY98 Research Forum, Dec. 1997, pp. 1-12, no date.

(Continued)

*Primary Examiner*—Minh N. Tang
(74) *Attorney, Agent, or Firm*—TraskBritt (57) ABSTRACT

A plasma probe includes a substrate having substantially the same properties as those of a substrate to be processed, a bottom electrode layer located over the substrate and electrically isolated therefrom, a dielectric layer positioned over the bottom electrode layer including apertures through which one or more electrodes of the bottom electrode layer are exposed, and at least one upper electrode layer electrically isolated from the bottom electrode layer by way of the dielectric layer. Electrodes of the bottom and upper electrode layers may communicate with meters which may provide real-time data representative of one or more properties of a region of a plasma to which the electrodes are exposed. The plasma probe may be fabricated by forming the bottom electrode layer over the substrate and separately forming one or more upper electrode layers over a sacrificial substrate. These structures are assembled with the dielectric layer therebetween.

23 Claims, 6 Drawing Sheets

OTHER PUBLICATIONS

Moyer, Rick, "UC San Diego Fluctuation and Turbulent Transport Diagnostics for NSTX," NSTX FY98 Research Forum, Dec. 1997, pp. 1-8, no date.

Rudakov, D.L. et al., "Probe Diagnostics," http://www.rsphysse.anu.edu.au/prl/probht.html, date unknown, 4 pages, no date/month/year.

* cited by examiner

PLASMA PROBE

CROSS-REFERENCE TO RELATED APPLICATION

This application is a divisional of application Ser. No. 10/663,587, filed Sep. 16, 2003, now U.S. Pat. No. 6,952,108, issued Oct. 4, 2005.

BACKGROUND OF THE INVENTION

1. Field of the Invention

The present invention relates generally to probes for monitoring plasmas during semiconductor device fabrication processes and, more specifically, to probes that are used to monitor plasma characteristics during semiconductor device fabrication processes. More particularly, the present invention relates to probes that may be used to monitor plasma characteristics in such a manner as to generate a three-dimensional representation of the state of a semiconductor substrate being exposed to the plasma. In addition, the present invention relates to probes that are in substantially the same electrical state as a semiconductor substrate exposed to the same or a similar plasma. The present invention also relates to methods for fabricating the probes of the present invention, as well as to methods for evaluating one or more characteristics of a plasma and the corresponding effects thereof on a semiconductor substrate.

2. Background of Related Art

Conventionally, plasma processes have been used to deposit materials onto substrate surfaces, as well as to remove materials from substrate surfaces. With respect to the use of plasmas in semiconductor device fabrication processes, some chemical vapor deposition (CVD) processes, which are commonly referred to as plasma-enhanced chemical vapor deposition (PECVD) processes, ion implantation processes, and dry etch processes (e.g., reactive ion etching (RIE)) each employ plasmas. When plasma processes are employed to deposit material onto or remove material from a substrate surface, the plasma may generate electric potentials on the surface. The electric potential generated by the plasma is defined by the energy of the ions and electrons in the plasma and the rate that such ions and electrons arrive at the surface during processing.

The electric potential at the substrate of a semiconductor device is important to define the condition and consistency of the plasma processing being used and the quality of the subsequent substrate. Thus, monitoring of the plasma potential may be used to monitor and improve semiconductor device quality.

Various techniques for monitoring the effects of plasmas on substrates have been developed, as have mechanisms for reducing the potentially damaging effects of plasmas on the delicate features of semiconductor device structures.

Conventionally, so-called Langmuir probes have been used to monitor various properties of plasmas, including electron density ($n_e$), electron temperature ($T_e$), and plasma potential ($V_p$). Langmuir probes typically include a small electrode that communicates with a power supply. When the electrode is placed in a plasma, the power supply may be used to bias the electrode to various potentials with respect to the plasma. By measuring the current that flows through the electrode and power supply, information on properties of the plasma within the vicinity of the electrode may be measured.

While conventional Langmuir probes include single electrodes and, thus, may only be used in evaluating the properties of a plasma at a single location thereof, state-of-the-art Langmuir probes include probe arrays, the use of which facilitates evaluation of a plasma at several locations. These state-of-the-art probe arrays typically include a number of identical, miniaturized Langmuir probes that are held into position with respect to one another by a planar substrate. In one exemplary probe array, the probes are spaced about one centimeter from one another.

Due to the extremely small dimensions of semiconductor device features, neither conventional Langmuir probes nor the state-of-the-art probe arrays are equipped to provide an accurate analysis of a plasma at the locations where plasma processes are being conducted upon a semiconductor device structure.

Further, the characteristics of a plasma are determined, at least in part, by conditions within the plasma, including a material or materials upon which plasma processes are being conducted. As the materials from which conventional and state-of-the-art Langmuir probes are different from the materials of semiconductor device structures, a plasma's characteristics may be much different in the presence of a conventional or even a state-of-the-art Langmuir probe than they would be in the presence of a semiconductor device structure.

Plasma sensors have been developed with the intent of simulating a plasma-processed wafer when subjected to a plasma. This type of plasma sensor includes the so-called "CHARM®" sensor disclosed in Lukaszek, et al., "CHARM®, a New Wafer Surface Charge Monitor," Tech Con '90, San Jose (hereinafter "Lukaszek 1"), and the "CHARM-2" sensor disclosed in U.S. Pat. No. 5,315,145, issued to Lukasek on May 24, 1994 (hereinafter "Lukaszek 2"). These sensors store data representative of the charge generated by a plasma at various locations thereof, which data may be evaluated only after the plasma processes have been conducted.

CHARM® plasma sensors include electrically erasable programmable read-only memory (EEPROM) transistors that collect and store data representative of a charge generated by a region of a plasma to which these transistors are subjected. Nonetheless, as indicated by Lukaszek 2, the EEPROM transistors of CHARM® plasma sensors store charge cumulatively (i.e., added together). By way of example, if an EEPROM transistor at a particular location of a CHARM® plasma sensor is subjected to a region of a plasma that generates a negative potential and is subsequently subjected to a region of a plasma that generates a positive potential, the amount of charge stored by that EEPROM transistor will be the sum of the negative and positive potentials. Thus, the EEPROM transistors of a CHARM® plasma sensor may not accurately represent the largest positive or negative potentials that were generated by regions of a plasma to which such transistors were subjected. Consequently, CHARM® plasma sensors may not accurately indicate plasma conditions which may result in damage to semiconductor device structures during fabrication thereof. Further, CHARM® plasma sensors are only capable of monitoring plasmas in two dimensions.

CHARM-2 plasma sensors are useful for monitoring both the negative and positive transient effects of a plasma. Diodes or combinations of diodes and resistors are provided in series between the electrodes at which plasma characteristics (e.g., voltage generation) are monitored and the EEPROM transistor of a CHARM-2 plasma sensor at which these plasma characteristics are stored. Nonetheless, due to their complexity, CHARM-2 plasma sensors are expensive to fabricate. Moreover, neither CHARM® plasma sensors nor CHARM-2 plasma sensors may be used to evaluate a plasma in real time.

U.S. Pat. No. 6,144,037, issued to Ryan et al. on Nov. 7, 2000 (hereinafter "Ryan"), discloses a capacitor charging sensor that, purportedly, more closely imitates the features of a semiconductor substrate during exposure thereof to plasma processes than do CHARM® and CHARM-2 plasma sensors. Nonetheless, the capacitor charging sensor of Ryan is not useful for monitoring the effects of a plasma on a semiconductor substrate in real time. Further, as with CHARM® plasma sensors, the usefulness of CHARM-2 plasma sensors in monitoring plasmas is limited to the two dimensions along the surfaces of such sensors.

While apparatus and methods for monitoring plasma electric potentials in real time is known, the actual electric currents and potentials and, thus, the quality of plasma processing are directly impacted by the dimension of each feature being processed.

Nonetheless, the inventor is not aware of any real time plasma monitoring devices or methods that facilitate measurement of electric potentials at structures that emulate processing of semiconductor device features at a sub-micron scale. Further, the inventor is not aware of plasma probes that are capable of monitoring a plasma in three dimensions.

SUMMARY OF THE INVENTION

A plasma probe incorporating teachings of the present invention includes a probe substrate, a bottom electrode layer on the substrate, and at least one upper electrode layer above the bottom electrode layer and spaced apart therefrom by way of an insulative layer.

The probe substrate may be formed from the same type of material and have substantially the same dimensions as other substrates that are to be exposed to a plasma. Using semiconductor device structures under fabrication on a silicon wafer as an example, the probe substrate may also comprise a silicon wafer. When plasma processes, such as deposition or etching processes in the semiconductor device fabrication example, are conducted on one or more substrates in the presence of such a plasma probe, the probe substrate may react to the plasma and have substantially the same effects on the plasma as those of the substrate or substrates upon which the plasma processes have been, are being, or will be conducted. By providing a plasma probe with a probe substrate that has substantially the same dimensions as the substrate or substrates upon which plasma processes are to be conducted, characteristics of the plasma can be monitored at locations that accurately correspond to locations on the surface of each processed substrate.

Each upper electrode layer of the plasma probe comprises an array of discrete electrodes that is located at positions on the substrate where measurement of plasma characteristics is desired. Each upper electrode may communicate, by way of corresponding conductive traces that are carried within dielectric material of sufficient thickness to withstand the voltages that may be generated by the plasma or are otherwise substantially isolated from the plasma, with a meter that facilitates monitoring of one or more characteristics of a plasma.

The bottom electrode layer of the plasma probe may include a single conductive layer that extends substantially over the probe substrate, a series of conductive traces, or an array of discrete electrodes at various locations across the substrate. If the bottom electrode layer includes an array of discrete electrodes, the positions of such bottom electrodes may be slightly offset from the locations of the corresponding upper electrodes. Like the upper electrodes, each bottom electrode may communicate with a meter.

The characteristics of a plasma may be evaluated at a number of locations over the surface of the plasma probe. By using the plasma probe to evaluate one or more characteristics of a plasma at a particular location of the plasma probe, the possible effects of the plasma on one or more corresponding locations of each substrate upon which plasma processes have been, are being, or will be conducted may be evaluated. In order to evaluate one or more of the characteristics of a plasma at a particular, analyzed location on the plasma probe and, thus, on a substrate that will be subjected to plasma processes, the upper electrode that is located at or closest to the desired location is identified. The measurements obtained by a meter in communication with that upper electrode are then compared with the measurements taken by a meter in communication with a bottom electrode that is exposed at a location on the probe substrate proximate to the location of either the upper electrode or the desired location.

A plasma probe embodying teachings of the present invention may be fabricated by forming one or more conductive structures, such as a single conductive layer, a plurality of conductive traces, or an array of electrodes and their corresponding conductive traces, over a dielectric or dielectric-lined surface of a probe substrate.

In addition, conductive structures, such as an array of electrodes, are formed over a surface of a sacrificial substrate or within recesses formed in the sacrificial substrate. If the conductive structures are formed on the sacrificial substrate, a dielectric layer that laterally surrounds the conductive structures is also formed. Conductive traces that communicate with the conductive structures and extend across portions of the dielectric layer that laterally surround the conductive structures are then formed.

Once conductive structures have been formed on both the probe substrate and the sacrificial substrate, a dielectric film may be formed or secured over the conductive structures on either or both of the probe substrate and the sacrificial substrate. The probe substrate and sacrificial substrate structures are then assembled with the layers of conductive structures on opposite sides of the last-applied dielectric film and with the probe substrate and the sacrificial substrate on opposite surfaces of the assembly. Upon removal of the sacrificial substrate, portions of the dielectric layer that lie laterally between the exposed, upper layer of conductive structures may be removed, exposing one or more conductive structures of the underlying layer or portions thereof that are located laterally between the upper layer of conductive structures. Each conductive structure may then be electrically connected to a corresponding meter.

In use, the plasma probe may be positioned within a reaction chamber with one or more other substrates upon which plasma processes are to be effected. When plasma processes are being effected, the properties of the plasma at each electrode may be monitored by way of a meter in communication therewith. As another approach, charge generated by the plasma may be stored by capacitors formed by spaced electrodes of the plasma probe at various locations thereof, then measured once the plasma has been shut off. As still another alternative, radiofrequency (RF) communication, as known in the art, may be used to transmit data from the processed substrate to external monitoring equipment.

Further, the plasma probe may be positioned in the same location and orientation within a reaction chamber as a substrate upon which plasma processes have been performed or will subsequently be performed. The plasma probe may then be exposed to a plasma having substantially the same properties as those used in the analyzed plasma process. Properties of the plasma at particular locations on the surface of the plasma probe and, thus, at corresponding locations of the substrate or substrates upon which plasma processes have been, are being, or will be conducted may be monitored by evaluating data provided by way of each upper electrode. If the probe includes more than one bottom electrode, the data provided by way of each bottom electrode may be correlated with that of its corresponding upper electrode to evaluate one or more characteristics of the plasma.

The resulting data, which indicates one or more of the characteristics of a plasma at several lateral locations and elevations on the probe, may then be used to generate a three-dimensional representation of the effects of the plasma on the probe. As probes incorporating teachings of the present invention are configured similarly to semiconductor substrates upon which plasma processes are to be performed and evaluated, the three-dimensional representation of the effects of the plasma on the probe may also provide a three-dimensional representation of the effects of the plasma on a processed semiconductor substrate. The ability to generate three-dimensional representations is significant, as the electric potential changes with differences in aspect ratio and has a significant impact on processing characteristics.

Other features and advantages of the present invention will become apparent to those of skill in the art through a consideration of the ensuing description, the accompanying drawings, and the appended claims.

BRIEF DESCRIPTION OF THE SEVERAL VIEWS OF THE DRAWINGS

In the drawings, which illustrate exemplary embodiments of various aspects of the present invention.

DETAILED DESCRIPTION OF THE INVENTION

Figure 1:
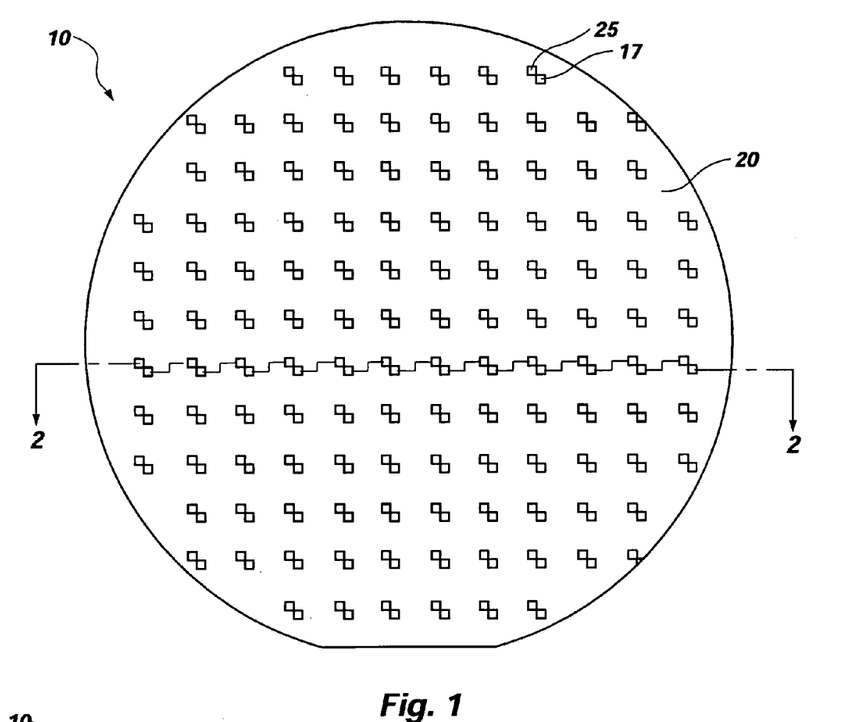
FIG. 1 is a top view of one embodiment of plasma probe incorporating teachings of the present invention, which includes a single bottom electrode.
Figure 2:
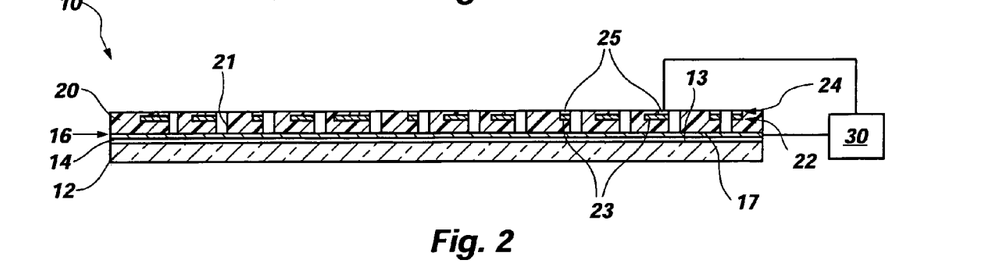
FIG. 2 is a cross-sectional representation of the plasma probe of FIG. 1, taken along line 2—2 thereof.

FIGS. 1 and 2 depict an exemplary embodiment of a plasma probe 10. Plasma probe 10 may include a substrate 12, which is also referred to herein as a probe substrate, a first dielectric layer 14, a bottom electrode layer 16, a second dielectric layer 20, a wiring layer 22, and an upper electrode layer 24.

Plasma probe 10 is used to evaluate one or more properties of a plasma to which a processed substrate has been, is being, or will be exposed and possibly the effects of the plasma on the processed substrate. The use of a probe substrate 12 that is formed from the same material as the processed substrate and that has substantially the same dimensions as the processed substrate may closely approximate the conditions that are present in a plasma when a processed substrate, rather than probe substrate 12, is present in the plasma. By way of example only, when plasma probe 10 is to be used to evaluate plasmas that are used in semiconductor device fabrication processes, probe substrate 12 may comprise a full or partial wafer of silicon, gallium arsenide, indium phosphide, or other semiconductor material, as well as a silicon-on-insulator (SOI) type substrate, such as a silicon-on-glass (SOG), silicon-on-ceramic (SOC), or silicon-on-sapphire (SOS) type substrate. Of course, when plasma probes incorporating teachings of the present invention are used to evaluate a plasma that is used for different purposes, the probe substrates thereof may be formed from a material that is more suited to the particular application for the evaluated plasma.

First dielectric layer 14 may be formed from any suitable dielectric material. As shown, first dielectric layer 14 may extend substantially over an active surface 13 of probe substrate 12. Continuing with the exemplary use of plasma probe 10 in evaluating plasmas that are to be used in semiconductor device fabrication processes, first dielectric layer 14 may comprise undoped silicon dioxide ($SiO_2$) or a doped silicon dioxide, or glass (e.g., borophosphosilicate glass (BPSG), borosilicate glass (BSG), phosphosilicate glass (PSG), etc.), as such materials are typically present in semiconductor device structures that are being fabricated.

Bottom electrode layer 16 may include a single layer of conductive material that extends substantially over probe substrate 12 and that is electrically isolated therefrom by way of first dielectric layer 14. Bottom electrode layer 16 may be formed from any conductive material that is typically used in semiconductor device structures (e.g., conductive polysilicon, aluminum, tungsten, titanium, gold, etc.) or any other material with sufficient electrical conductivity (e.g., copper). Bottom electrode layer 16 communicates with one or more meters 30. Each meter 30, in turn, communicates with an upper electrode 25 of upper electrode layer 24 or with a voltage reference (not shown), such as a ground (Vcc) or a power supply (Vss).

Second dielectric layer 20 overlies bottom electrode layer 16. Second dielectric layer 20 may be formed from any suitable material (e.g., silicon oxide, silicon nitride, glass, or a polymer, such as polyimide, etc.) that will electrically insulate bottom electrode layer 16 from overlying conductive structures, such as conductive traces 23 of wiring layer 22 and upper electrodes 25 of upper electrode layer 24. While upper electrodes 25 are exposed at an upper surface of second dielectric layer 20, conductive traces 23 that communicate with each of upper electrodes 25 are carried internally by second dielectric layer 20. Thus, in addition to insulating conductive traces 23 and bottom electrode layer 16 from one another, second dielectric layer 20 prevents conductive traces 23 from being directly exposed to a plasma. Second dielectric layer 20 also electrically isolates adjacent conductive traces 23 from one another. The thickness of second dielectric layer 20 depends, at least in part, upon the desired distance above active surface 13 of probe substrate 12 at which the effects of a plasma are to be evaluated.

As with bottom electrode layer 16, conductive traces 23 and upper electrodes 25 may be formed from any material with sufficient electrical conductivity, including conductive materials that are typically used in semiconductor devices. Preferably, in order to convey signals that are generated by a plasma in a similar manner to the signals that are generated by the plasma in bottom electrode layer 16, conductive traces 23 and upper electrodes 25 are formed from a material that has electrical conductivity properties that are similar to or substantially the same as those of the conductive material from which bottom electrode layer 16 is formed.

Each conductive trace 23 communicates with a corresponding upper electrode 25, facilitating electrical connection of the same with a meter 30. Meter 30, in turn, may communicate with either bottom electrode layer 16 or a voltage reference (not shown), such as a ground (Vcc) or a power source (Vss), as known in the art (e.g., by way of test pads or other external conductive elements).

Upper electrodes 25, which may be arranged over probe substrate 12 in an array, are electrically isolated from one another. The positions of upper electrodes 25 may be random or based on locations of a corresponding processed substrate where structures that may be adversely affected by a plasma (e.g., in the example of semiconductor devices, thin dielectric layers such as gate and capacitor dielectrics) are positioned. Upper electrodes 25 may be exposed at a surface of second dielectric layer 20, as depicted in FIGS. 1 and 2, or within apertures 21 that are formed in second dielectric layer 20.

As depicted, apertures 21 of second dielectric layer 20 extend substantially therethrough to expose regions of bottom electrode layer 16. Each aperture 21 may be positioned laterally adjacent a corresponding upper electrode 25.

When plasma probe 10 is in use, various locations of bottom electrode layer 16 are exposed to a plasma, which may have different properties at different locations. Since bottom electrode layer 16 comprises a single member, signals that are generated by an evaluated plasma at the various locations thereof will be averaged out. The averaged signal obtained with bottom electrode layer 16 may be compared to a voltage reference or to various signals that are generated by an evaluated plasma at upper electrodes 25. Likewise, the signals generated by an evaluated plasma at each upper electrode 25 may be compared with the averaged signal obtained with bottom electrode layer 16 or with a voltage reference. The potential difference between the signal generated at each upper electrode 25 and bottom electrode layer 16 may be determined as known in the art and provides information about the plasma at the longitudinal positions (relative to the plane of probe substrate 12) of upper electrodes 25 to the longitudinal position of bottom electrode layer 16.

Figure 3:
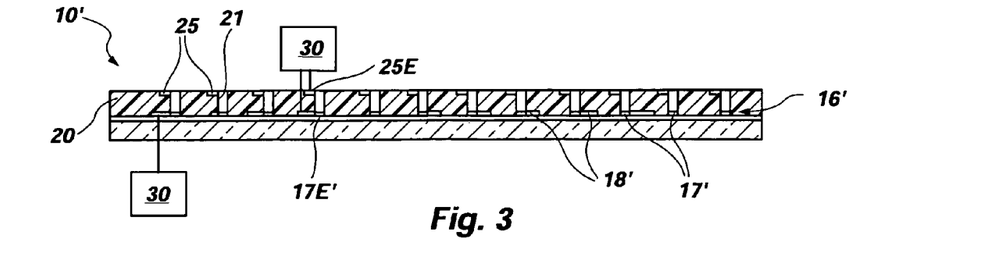
FIG. 3 is cross-sectional representation of another embodiment of plasma probe of the present invention, which includes an array of bottom electrodes.

Referring now to FIG. 3, another embodiment of plasma probe 10' of the present invention is shown. All of the features of plasma probe 10' are substantially the same as those described in reference to FIGS. 1 and 2, except for bottom electrode layer 16', which includes an array of separate, electrically isolated bottom electrodes 17' and a conductive trace 18' that corresponds to and communicates with each bottom electrode 17'.

Each bottom electrode 17' is positioned laterally proximate to the location of a corresponding upper electrode 25. To facilitate the exposure of bottom electrodes 17' to a plasma when plasma probe 10' is in use, bottom electrodes 17' are at least partially exposed through apertures 21 formed through second dielectric layer 20.

Conductive traces 18' electrically connect each bottom electrode 17' to a corresponding meter 30. Accordingly, when a bottom electrode 17' is exposed to a plasma, its corresponding conductive trace 18' communicates an electrical signal representative of one or more properties of the plasma at the location of bottom electrode 17' to meter 30.

In use, one or more properties of a plasma at a specific location thereof may be determined by evaluating the signals measured at a bottom electrode 17', upper electrode 25, or a combination thereof positioned at or proximate that specific location. By way of example, the properties of a plasma may be determined at the surface of probe substrate 12 at the location of bottom electrode 17E' by evaluating a signal generated by the plasma at bottom electrode 17E', which, in addition to communicating with a meter 30, also communicates with a voltage reference, such as a ground or a power source. One or more properties of a plasma at a fixed elevation above probe substrate 12 and at the lateral location of an upper electrode 25E may similarly be determined by evaluating a signal generated by the plasma at upper electrode 25E and measured by a meter 30 in communication with that upper electrode 25E. Of course, upper electrode 25E also communicates with a reference voltage, such as a ground or a power source. The same reference voltage may be used for both bottom electrodes 17' and upper electrodes 25. As another alternative, the effects of a plasma between the elevations of a particular bottom electrode 17E' and its corresponding upper electrode 25E may be determined by evaluating a meter in communication with both bottom electrode 17E' and upper electrode 25E.

Figure 4:
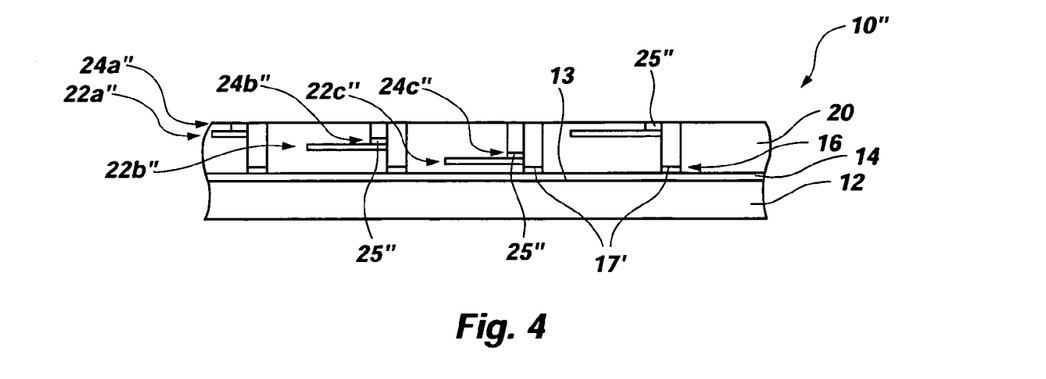
FIG. 4 is a cross-sectional representation of yet another embodiment of plasma probe according to the present invention, in which upper electrodes at some lateral locations are positioned at a different height relative to the substrate than the heights of upper electrodes at other lateral locations above the substrate.

The embodiment of plasma probe 10" depicted in FIG. 4 includes a probe substrate 12, a first dielectric layer 14, a bottom electrode layer 16, a second dielectric layer 20, a plurality of wiring layers 22a", 22b", 22c", etc. (collectively wiring layers 22"), and a plurality of upper electrode layers 24a", 24b", 24c", etc. (collectively electrode layers 24").

As shown, each upper electrode layer 24a", 24b", 24c", etc., is positioned a different distance above an active surface 13 of probe substrate 12 than the other upper electrode layers 24a", 24b", 24c", etc. Thus, plasma probe 10" includes upper electrodes 25" that are positioned at at least two different elevations with respect to probe substrate 12. As in the embodiment depicted in FIG. 3, each upper electrode 25" is positioned laterally proximate a corresponding bottom electrode 17'.

Plasma probe 10" operates in substantially the same manner as plasma probe 10'. Since upper electrodes 25" are in more than one layer 24a", 24b", 24c", etc., the properties of a plasma may be measured at different elevations above the active surface 13 of probe substrate 12. Of course, the lateral locations of plasma probe 10" at which the properties of a plasma at a particular elevation relative to active surface 13 may be evaluated are limited to the locations of upper electrodes 25" at that particular elevation.

Figure 5:
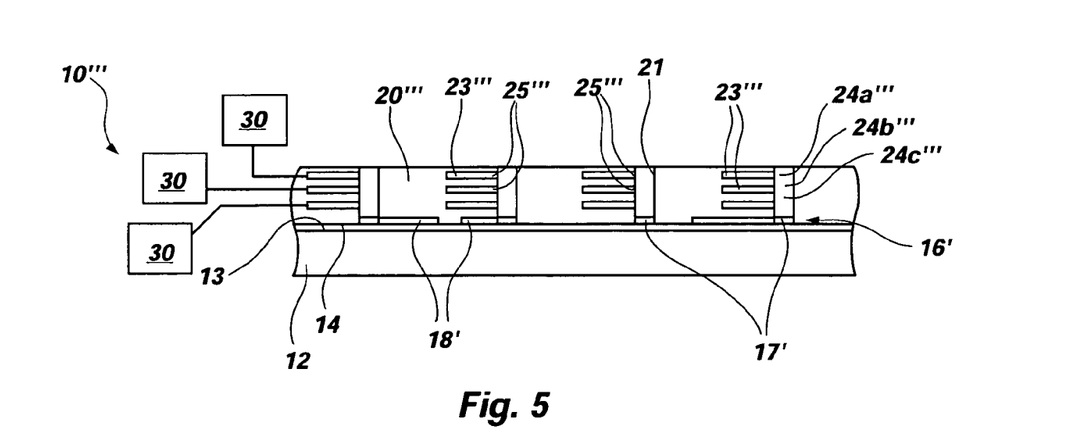
FIG. 5 is a cross-sectional representation of still another embodiment of plasma probe according to the present invention, which includes multiple levels of upper electrodes at one or more lateral locations over the probe substrate.

Turning now to FIG. 5, another embodiment of plasma probe 10''' that incorporates teachings of the present invention is shown. Plasma probe 10''' includes a probe substrate 12 with an active surface 13 and a first dielectric layer 14 covering at least portions of active surface 13. A bottom electrode layer 16', which includes an array of bottom electrodes 17' and their corresponding conductive traces 18', is positioned over first dielectric layer 14, which electrically isolates bottom electrodes 17' and conductive traces 18' from the material of probe substrate 12. One or more second dielectric layers 20''' overlie bottom electrode layer 16'. Each bottom electrode 17' is at least partially exposed through an aperture 21 formed through second dielectric layer(s) 20'''.

Plasma probe 10''' also includes upper electrode layers 24a''', 24b''', 24c''', etc. (collectively upper electrode layers 24''') that are located at different elevations above active surface 13 of probe substrate 12. Upper electrode layers 24''' may be carried internally by a single second dielectric layer 20''' or positioned between adjacent second dielectric layers 20'''. If plasma probe 10''' includes multiple second dielectric layers 20''', each second dielectric layer 20''' electrically isolates upper electrode layers 24''' from one another, as well as from bottom electrode layer 16'. Second dielectric layers 20''' may also electrically isolate each upper electrode 25''' and conductive trace 23''' of each upper electrode layer 24''' from one another. The height or elevation of each upper electrode layer 24''' over active surface 13 of probe substrate 12 is determined by the collective thicknesses of the underlying first dielectric layer 14, bottom electrode layer 16', and second dielectric layer(s) 20'''. In addition, if upper electrode layers 24''' are not fully recessed within one or both of the second dielectric layers 20''' adjacent thereto, the thicknesses of any upper electrode layer(s) 24''' that underlie a particular upper electrode layer 24''' may contribute to the height or elevation of that upper electrode layer 24'''.

As depicted, corresponding upper electrodes 25''' of different upper electrode layers 24a''', 24b''', 24c''', etc., respectively, may be positioned at substantially the same lateral location of plasma probe 10'''. Each upper electrode 25''' may comprise an end portion of a conductive trace 23''', as depicted, that is exposed to an aperture 21 through which a corresponding bottom electrode 17' is exposed. Thus, each bottom electrode 17' and its corresponding upper electrodes 25''' are exposed to a plasma by way of the same aperture 21.

As each upper electrode 25''' communicates with a different meter 30, one or more properties of a plasma at a particular lateral location over plasma probe 10''' may be evaluated at each of the different elevations of upper electrodes 25''' and a corresponding bottom electrode 17' within a single aperture 21 at that lateral location.

With reference now to FIGS. 6–20, an exemplary method is described by which plasma probes incorporating teachings of the present invention, such as plasma probes 10 and 10', depicted in FIGS. 1–3, may be fabricated.

FIGS. 6–12 illustrate the fabrication of an upper part of a plasma probe, while FIGS. 13–16 depict fabrication of a bottom part of a plasma probe and FIGS. 17–20 illustrate assembly of the top and bottom plasma probe parts, as well as finishing of a plasma probe.

Figure 6:
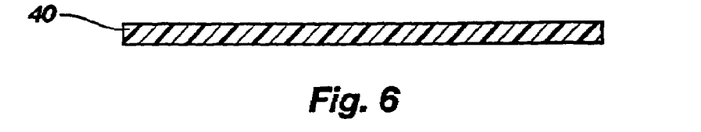
FIGS. 6–20 depict an exemplary manner in which a plasma probe incorporating teachings of the present invention may be fabricated.

In FIG. 6, a sacrificial substrate 40 is provided. Sacrificial substrate 40 is a substantially planar member which serves as a substrate for the fabrication of conductive structures. The material of sacrificial substrate 40 may be selectively patterned with respect to the conductive materials that are to be subsequently deposited thereon or laminated thereto. By way of example only, sacrificial substrate 40 may comprise a film of nylon or polystyrene.

Figure 7:
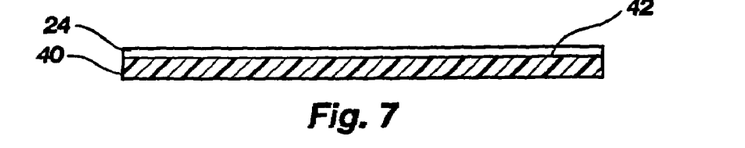

FIG. 7 depicts a layer 24 that includes conductive material on a surface 42 of sacrificial substrate 40. The conductive material of layer 24 may be any type of conductive material with electrical properties that are suited for use in a plasma probe. For example, and not to limit the scope of the present invention, layer 24 may comprise copper, aluminum, titanium, tungsten, gold, polysilicon, and the like. Layer 24 may be preformed and laminated onto surface 42 either before or after sacrificial substrate 40 has been provided. Alternatively, layer 24 may be formed by known deposition processes, such as physical vapor deposition ("PVD") (e.g., sputtering) or chemical vapor deposition ("CVD") techniques, that are appropriate for the material thereof.

Figure 8:
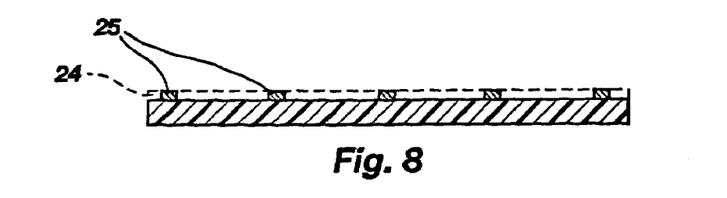

As depicted in FIG. 8, layer 24 is patterned to form upper electrodes 25 therefrom. Known patterning processes, such as those employed in semiconductor device fabrication processes, may be used. As an example, a mask may be formed over layer 24 to protect regions thereof that will form upper electrodes 25, unprotected regions of layer 24 may then be exposed to an etchant therefor to remove conductive material from the unprotected regions and to thereby form upper electrodes 25, and the mask may then be removed from above upper electrodes 25.

Figure 9:
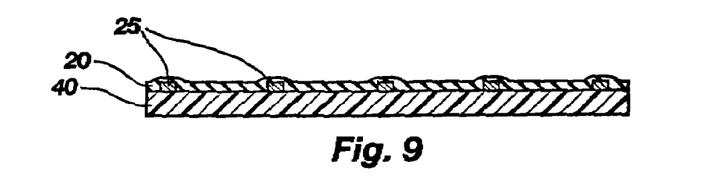

Once upper electrodes 25 have been formed, a dielectric layer 20 may be disposed thereover, as shown in FIG. 9. Dielectric layer 20 may be a preformed layer that is positioned over upper electrodes 25. Alternatively, dielectric material may be formed by coating (e.g., spray coating, roller coating, spin-on coating, etc.) dielectric material (e.g., a polymer) onto upper electrodes 25. As another alternative, a dielectric material such as glass, silicon oxide, silicon nitride, or silicon oxynitride may be deposited (e.g., by CVD) onto upper electrodes 25 to form a dielectric layer 20 thereover. Electrically nonconductive oxides may also be grown on upper electrodes 25 to form a dielectric layer 20 that covers only portions of sacrificial substrate 40. Dielectric layer 20 may also be formed from spin-on glass ("SOG") by way of appropriate spin-on techniques.

Figure 10:
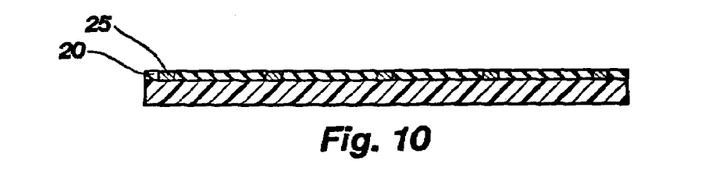

Turning now to FIG. 10, dielectric layer 20 may be patterned by way of suitable processes (e.g., mask and etch techniques) to at least partially expose upper electrodes 25 therethrough.

Figure 11:
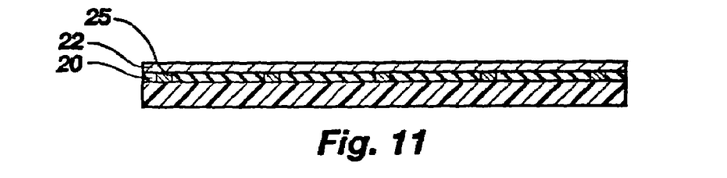
Figure 12:
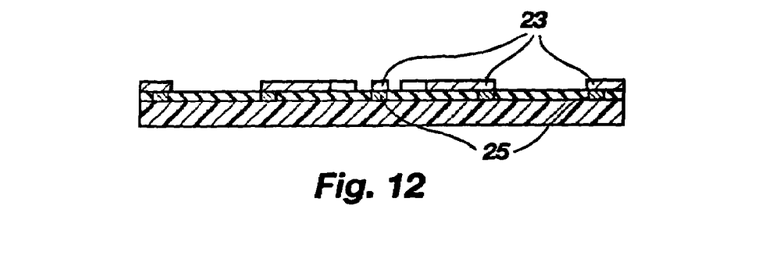

As shown in FIG. 1, a layer 22 comprising electrically conductive material may be formed over dielectric layer 20 and in contact with the portions of upper electrodes 25 that are exposed therethrough. Known processes, such as PVD or CVD processes, that are appropriate for the type or types of conductive material to be used to form layer 22 may be used to form layer 22. Known processes (e.g., mask and etch techniques) may be employed to pattern layer 22 and to form conductive traces 23 therefrom, as shown in FIG. 12. Each conductive trace 23 includes a portion that contacts and, thus, communicates with a corresponding upper electrode 25.

The processes described in reference to FIGS. 7–12 may be repeated to form the additional upper electrode layers 24'' and their corresponding wiring layers 22'' of the embodiment of plasma probe 10'' depicted in FIG. 4.

In the fabrication of a plasma probe 10''' such as that illustrated in FIG. 5, the processes described with reference to FIGS. 6 and 7 are employed, but the processes shown in and described with reference to FIGS. 8–12 are replaced with those depicted in FIGS. 8A and 9A.

Figure 8A:
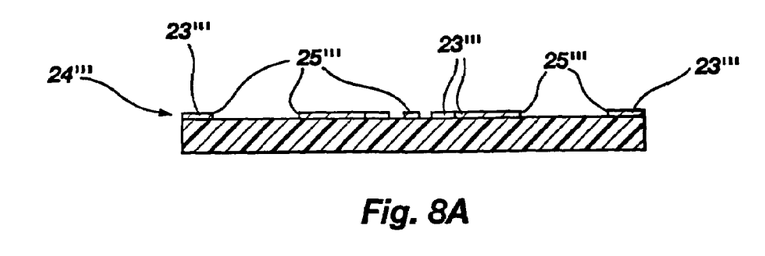

FIG. 8A depicts the patterning of layer 24''' by known processes (e.g., mask and etch techniques) to form upper electrodes 25''', as well as their corresponding conductive traces 23''', of an upper electrode layer 24'''. If another upper electrode layer 24''' is to be subsequently formed, a dielectric layer 20 may be formed over upper electrodes 25''' and conductive traces 23''', as shown in FIG. 9A, to electrically isolate the same from a subsequently formed upper electrode layer 24'''. In the finished plasma probe 10''', each subsequently formed upper electrode layer 24''' will underlie all of the previously formed upper electrode layers 24'''. The processes illustrated in FIGS. 8A and 9A may be repeated until a desired number of upper electrode layers 24''' have been formed.

FIGS. 13–16 illustrate an exemplary method that may be used to fabricate each of the embodiments of plasma probe that has been described herein.

Figure 13:
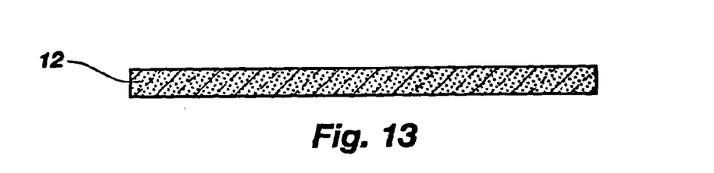

In FIG. 13, a probe substrate 12 is provided. Probe substrate 12 may be formed from the same type of material as that of a processed substrate that will be, is being, or has been subjected to the same process plasma as that evaluated by the probe or by a plasma having substantially the same properties and generated by the same apparatus as the evaluated process plasma. In addition, probe substrate 12 has substantially the same dimensions as such a processed substrate.

Figure 14:
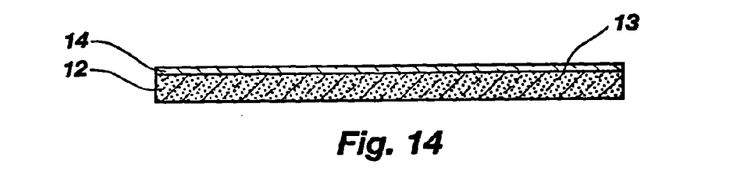

If probe substrate 12 does not comprise or is not coated with a dielectric material, a dielectric layer 14 may be formed over at least portions of an active surface 13 thereof, as shown in FIG. 14. Dielectric layer 14 may be formed from any material that is compatible with and that will adhere to probe substrate 12 while electrically isolating subsequently formed conductive structures from probe substrate 12. Known processes may be used to form dielectric layer 14. By way of example only, if probe substrate 12 comprises silicon or another semiconductor material (e.g., gallium arsenide, indium phosphide, etc.), dielectric layer 14 may comprise an oxide of the semiconductor material (e.g., a silicon oxide) and be grown on at least portions of active surface 13 by exposure thereof to oxidizing conditions (e.g., heat, oxidants, or combinations thereof, etc.). As another example, a dielectric layer 14 comprising a material such as a glass, a silicon oxide, a silicon nitride, or a silicon oxynitride may be formed on active surface 13 by suitable deposition processes (e.g., CVD). In the case of glass, known spin-on glass techniques may also be employed. Alternatively, a polymer may be coated onto all or part of active surface 13 to form dielectric layer 14.

Figure 15:
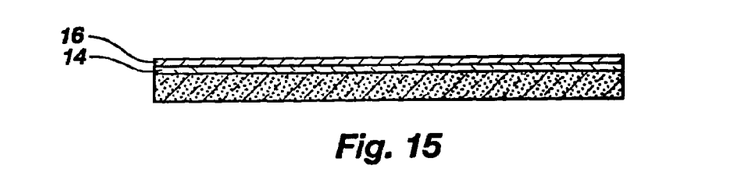

Referring now to FIG. 15, a layer 16 comprising a conductive material, such as a metal (e.g., copper, aluminum, titanium, tungsten, gold, etc.) or polysilicon, is formed over dielectric layer 14. Layer 16 may be formed by known deposition processes, such as PVD or CVD, that are suitable for the type of conductive material being deposited.

Figure 16:
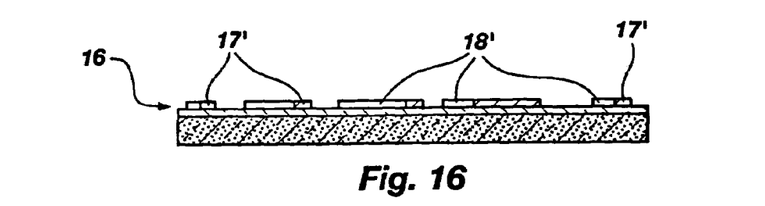

As shown in FIG. 16, layer 16 may be patterned by known processes (e.g., mask and etch techniques) to form bottom electrodes 17 (see also FIGS. 1 and 2), 17' (FIG. 3), as well as any corresponding conductive traces 18'.

Figure 9A:
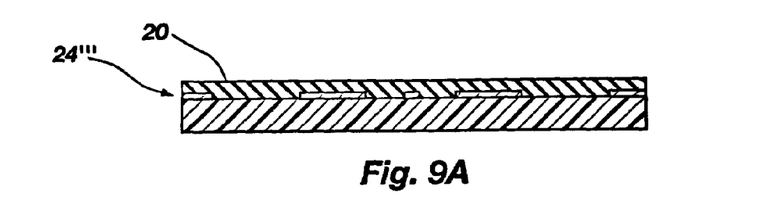
Figure 17A:
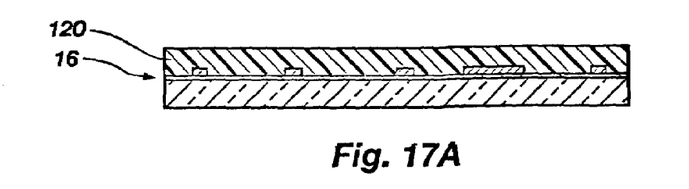
Figure 17B:
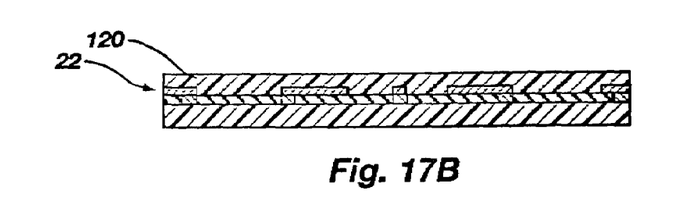

Turning now to FIGS. 17A and 17B, a layer 120 comprising dielectric material may be disposed over either layer 16, as shown in FIG. 17A, or over the most recently formed layer 22, as shown in FIG. 17B (see also FIG. 11) (or over the most recently formed layer 24''' of FIG. 9A). Layer 120 may comprise any dielectric material suitable for use in fabricating semiconductor device structures and may be formed by any suitable process, depending, of course, upon the type of dielectric material employed. For example, layer 120 may comprise a polymer and be formed by known application processes (e.g., spin-coating, spray-coating, spreading with a doctor blade, etc.) or a preformed layer or film of polymeric material. If a polymer is used, it is preferred that the polymer comprise an adhesive material or a material that is capable of adhering to the layer to which it is applied, as well as to the exposed dielectric material or conductive material of the other half of probe substrate 10, 10', 10'', 10''' (FIGS. 1–5). By way of example, the material of dielectric layer 120 may comprise a tacky or "pressure sensitive" adhesive that is capable of adhering to another structure upon contact therewith. Alternatively, dielectric layer 120 may comprise a polymer that has not completely cured and that will adhere to another structure upon being positioned adjacent thereto and subjected to appropriate curing conditions (e.g., heat, radiation of an appropriate wavelength, etc.). As another alternative, an exposed surface or at least portions thereof may be partially dissolved to facilitate adhesion of layer 120 to another structure.

Figure 18:
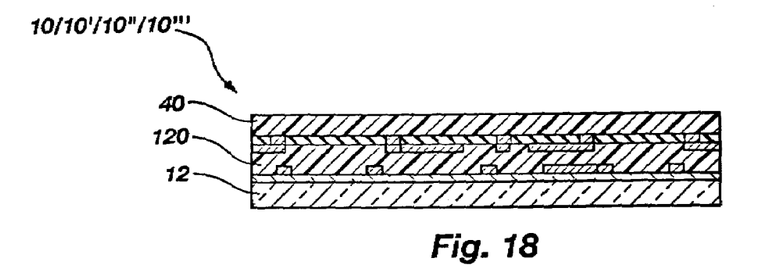

Turning now to FIG. 18, the top part of a probe substrate incorporating teachings of the present invention (FIGS. 9A, 12, 17B) is assembled with the bottom part of the probe substrate (FIGS. 16 and 17A). In assembling a probe substrate 10, 10', 10'', 10''', the top and bottom parts thereof are aligned with one another. Sacrificial substrate 40 and probe substrate 12 are located at opposite sides of the assembly.

Figure 19:
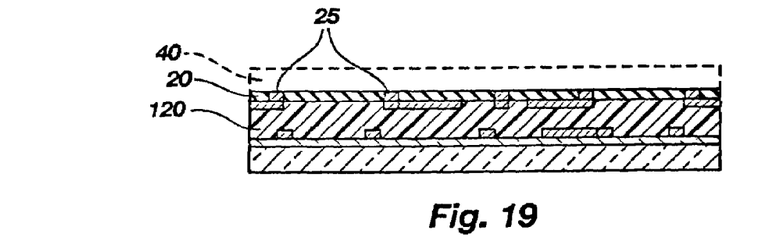

In FIG. 19, sacrificial substrate 40 is removed from the assembly, exposing upper electrodes 25 and dielectric material of regions of layer 20 that are laterally adjacent to upper electrodes 25. By way of example, sacrificial substrate 40 may be exposed to a solvent or an etchant that will remove the material thereof. Such an etchant may have selectivity for the material of sacrificial substrate 40 (e.g., nylon, polystyrene, etc.) over the materials of underlying structures, such as upper electrodes 25 and dielectric layer 20. Alternatively, a more nonselective etchant may be removed once upper electrodes 25 are exposed therethrough. As an alternative to the use of etchants, known planarization processes (e.g., mechanical planarization or chemical-mechanical planarization processes) may be used to expose upper electrodes 25 through sacrificial substrate 40. As yet another alternative, sacrificial substrate 40 may be removed by thermal degradation.

Figure 20:
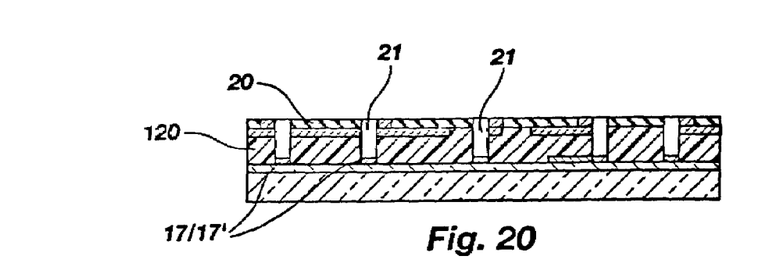

As shown in FIG. 20, each dielectric layer 20, 120 may be patterned, as known in the art (e.g., by mask and etch processes), to form apertures 21 therethrough, through which portions of electrode 17 or individual electrodes 17' are exposed. In the embodiment of plasma probe 10'' shown in FIG. 4, mid-level upper electrodes 25'' may also be exposed through apertures 21 that have been formed in dielectric layers 20, 120. Dielectric layers 20, 120 of plasma probe 10''' of FIG. 5 may be similarly patterned to form apertures 21 through which at least portions of electrode(s) 17, 17' and upper electrodes 25''' are exposed.

Figure 21:
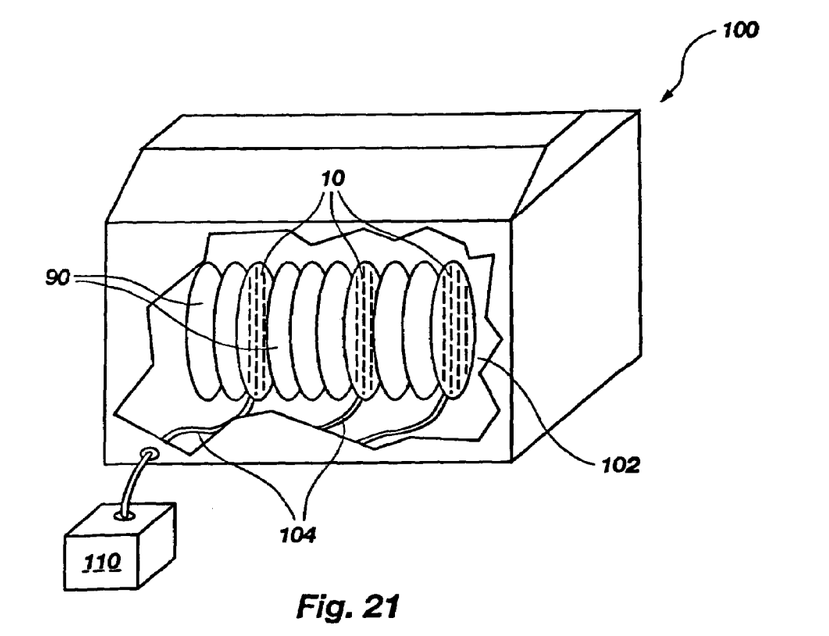
FIG. 21 is a schematic representation of one method in which a plasma probe incorporating teachings of the present invention may be used.

Referring now to FIG. 21, a first exemplary use of a plasma probe 10 according to the present invention is illustrated. One or more plasma probes 10 are positioned, along with one or more processed substrates 90, within a chamber 102 of plasma process apparatus 100, such as a plasma-enhanced chemical vapor deposition ("PECVD") apparatus or an etching apparatus that utilizes a plasma. Plasma processes may then be conducted within chamber 102 of plasma process apparatus 100, as known in the art. While plasma processes are being conducted within chamber 102, signals are generated by the plasma at various locations (i.e., at the locations of exposed electrodes 17, 25) (FIGS. 1 and 2) of each plasma probe 10. Data representative of these signals may be stored or transmitted by way of circuitry 104 to diagnostic apparatus 110, which may store or process the data. Upon being processed, data representative of the signals generated by a plasma at each electrode 17, 25 of plasma probe 10 provide information about one or more characteristics of the plasma at the respective location of each electrode 17, 25.

Figure 22:
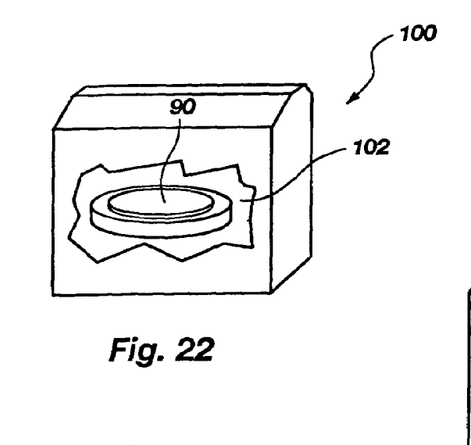
FIGS. 22 and 23 schematically depict another method in which a plasma probe according to the present invention may be used.

Alternatively, as depicted in FIG. 22, one or more processed substrates 90 may be placed within a chamber 102 of a plasma process apparatus 100. In this embodiment of plasma evaluation method, no plasma probes 10 (FIG. 23) are located within chamber 102 as a plasma is generated therein to conduct a plasma process (e.g., deposition, patterning, etc.) on each processed substrate 90 that has been positioned within chamber 102.

Figure 23:
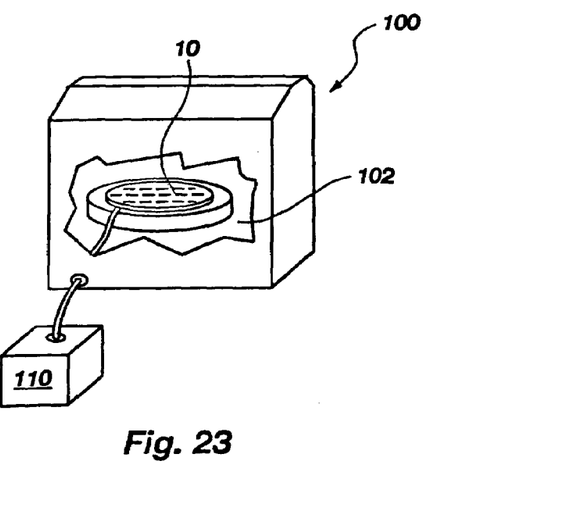

In FIG. 23, one or more plasma probes 10 may be introduced into chamber 102 of the same plasma process apparatus 100 as that depicted in FIG. 22, but without any processed substrates 90 (FIG. 22) being positioned within chamber 102. A plasma having substantially the same properties (e.g., chemical concentrations, excitation energy, temperature, etc.) as the plasma to which processed substrate 90 is exposed in FIG. 22 is generated within chamber 102. As the one or more plasma probes 10 located within chamber 102 are exposed to the plasma, data representative of the signals generated by the plasma at electrodes 17, 25 (FIGS. 1 and 2) of each plasma probe 10 may be stored or communicated to diagnostic apparatus 110 to be stored or processed thereby. Data may be collected by plasma probe 10 in this manner before or after plasma processes are performed by exposing one or more processed substrates 90 to a plasma having substantially the same properties, as described with reference to FIG. 22.

As data indicative of the effects of a plasma on a probe of the present invention may be obtained from a variety of lateral locations on the plasma probe and at two or more different elevations (e.g., the elevations of electrodes 17' and 25) thereof, the data may be correlated to the particular, corresponding locations on the probe to generate a three-dimensional representation of the effects of the plasma on the probe. This three-dimensional representation may also represent the effects of the same plasma or a similar plasma on similarly configured and oriented processed semiconductor substrates of which the probe is an exemplar and, thus, provide a three-dimensional representation of the effects of the plasma or a plasma of similar characteristics on such a processed semiconductor substrate.

Although the foregoing description contains many specifics, these should not be construed as limiting the scope of the present invention, but merely as providing illustrations of some exemplary embodiments. Similarly, other embodiments of the invention may be devised which do not depart from the spirit or scope of the present invention. Features from different embodiments may be employed in combination. The scope of the invention is, therefore, indicated and limited only by the appended claims and their legal equivalents, rather than by the foregoing description. All additions, deletions, and modifications to the invention, as disclosed herein, which fall within the meaning and scope of the claims are to be embraced thereby.

What is claimed is:

1. A plasma probe, comprising:
   a semiconductor substrate;
   a first dielectric layer formed on the semiconductor substrate;
   at least one first electrode on the first dielectric layer;
   a dielectric structure on at least portions of the at least one first electrode, dimensions of the portions of the at least one first electrode along a plane of the at least one first electrode being substantially the same as corresponding dimensions of the dielectric structure along a plane of the dielectric structure that is parallel to the plane of the at least one first electrode; and
   at least one second electrode on the dielectric structure, dimensions of the at least one second electrode along a plane thereof being substantially the same as the corresponding dimensions of the dielectric structures,
   the at least one first electrode, the dielectric structure, and the at least one second electrode configured for monitoring a plasma.

2. The plasma probe of claim 1, wherein a distance between the plane of the at least one first electrode and the plane of the at least one second electrode is substantially the same as a height of at least one feature on a fabrication substrate to undergo substantially the same processing as that to be monitored with the plasma probe.

3. The plasma probe of claim 1, wherein the at least one second electrode comprises a plurality of second electrode sets, each being located in a different plane oriented substantially parallel to the plane of the at least one first electrode, so as to facilitate generation of a three-dimensional representation of at least one characteristic of a plasma to be monitored with the plasma probe.

4. The plasma probe of claim 3, wherein a plane of each second electrode set is located at an elevation relative to the plane of the at least one first electrode which corresponds to an elevation of a feature on a fabrication substrate to undergo substantially the same processing as that to be monitored by the plasma probe.

5. The plasma probe of claim 1, comprising a plurality of second electrodes.

6. The plasma probe of claim 5, wherein adjacent second electrodes of the plurality of second electrodes are spaced apart from one another a distance which is substantially the same as a corresponding lateral distance of a feature of a fabrication substrate to undergo substantially the same processing as that to be monitored by the plasma probe.

7. The plasma probe of claim 1, wherein the at least one first electrode is configured to communicate with a meter.

8. The plasma probe of claim 1, wherein the at least one second electrode is configured to communicate with a meter.

9. The plasma probe of claim 1, comprising a plurality of electrically distinct second electrodes.

10. The plasma probe of claim 9, wherein portions of the at least one first electrode are exposed between adjacent second electrodes of the plurality of second electrodes.

11. The plasma probe of claim 9, further comprising at least one other first electrode, the at least one other first electrode being in a different plane than both the at least one first electrode and the plurality of second electrodes.

12. The plasma probe of claim 1, wherein the semiconductor substrate comprises a same type of semiconductor substrate as that with which the plasma probe is to be used.

13. The plasma probe of claim 1, wherein the semiconductor substrate comprises a silicon-on-insulator type substrate.

14. The plasma probe of claim 13, wherein the silicon-on-insulator type substrate comprises one of a silicon-on-glass substrate, a silicon-on-sapphire substrate, and a silicon-on-ceramic substrate.

15. The plasma probe of claim 1, wherein the semiconductor substrate comprises at least a partial wafer comprising semiconductive material.

16. The plasma probe of claim 15, wherein the semiconductive material comprises at least one of silicon, gallium arsenide, and indium phosphide.

17. The plasma probe of claim 1, wherein the dielectric structure comprises polyimide.

18. A plasma probe, comprising:
   a semiconductor substrate;
   a dielectric layer on the semiconductor substrate;
   at least one first electrode on the dielectric layer;

a dielectric structure on at least portions of the at least one first electrode; and at least one second electrode on the dielectric structure, the at least one first electrode, the dielectric structure, and the at least one second electrode configured for monitoring a plasma.

19. The plasma probe of claim 18, wherein at least one of a location, a configuration, and dimensions of at least one of the dielectric structure and the at least one second electrode are substantially the same as at least one of a location, a configuration, and dimensions of a corresponding feature on a fabrication substrate to undergo substantially the same processing conditions as those to be monitored with the plasma probe.

20. The plasma probe of claim 18, comprising at least another electrode at a different elevation than the at least one first electrode and the at least one second electrode.

21. The plasma probe of claim 20, wherein the at least another electrode comprises another first electrode.

22. The plasma probe of claim 20, wherein the at least another electrode comprises another second electrode.

23. The plasma probe of claim 18, wherein the portions of the at least one first electrode, the dielectric structure, and the at least one second electrode have substantially the same lateral dimensions.

* * * * *

UNITED STATES PATENT AND TRADEMARK OFFICE
CERTIFICATE OF CORRECTION

| | | |
|---|---|---|
| PATENT NO. | : 7,129,724 B2 | Page 1 of 1 |
| APPLICATION NO. | : 11/190437 | |
| DATED | : October 31, 2006 | |
| INVENTOR(S) | : Blalock | |

It is certified that error appears in the above-identified patent and that said Letters Patent is hereby corrected as shown below:

In column 14, line 2, in Claim 1, delete "structures," and insert -- structure, --, therefor.

Signed and Sealed this

Fifteenth Day of April, 2008

JON W. DUDAS
*Director of the United States Patent and Trademark Office*